US005880390A

United States Patent [19]

Hagiwara

[11] Patent Number: 5,880,390

[45] Date of Patent: Mar. 9, 1999

[54] REVERBERATION EFFECT IMPARTING APPARATUS

[75] Inventor: Hideki Hagiwara, Hamamatsu, Japan

[73] Assignee: Yamaha Corporation, Shizuoka-ken, Japan

[21] Appl. No.: 935,542

[22] Filed: Sep. 23, 1997

[30] Foreign Application Priority Data

Oct. 7, 1996 [JP] Japan .................................... 8-266296

[51] Int. Cl.[6] ................................ G10H 1/02; H03G 3/00

[52] U.S. Cl. .......................... 84/630; 84/DIG. 26; 381/63

[58] Field of Search .............................. 84/603–607, 630, 84/DIG. 26; 381/63–65

[56] References Cited

U.S. PATENT DOCUMENTS

| | | | |
|---|---|---|---|
| 4,350,072 | 9/1982 | Deutsch | 84/630 X |
| 4,947,723 | 8/1990 | Kawashima et al. | 84/630 X |
| 4,984,495 | 1/1991 | Fujimori | 84/630 X |
| 5,000,074 | 3/1991 | Inoue et al. | 84/630 X |
| 5,613,147 | 3/1997 | Okamura et al. | 84/630 X |
| 5,619,579 | 4/1997 | Ando et al. | 84/630 X |

*Primary Examiner*—Stanley J. Witkowski
*Attorney, Agent, or Firm*—Hazel & Thomas, P.C.

[57] ABSTRACT

In a reverberation effect imparting apparatus, sampled data of an input signal is written into a RAM 23 and the data is read out after an elapse of a predetermined time period, thereby imparting a reverberation effect. A storage area of the RAM 23 is divided into an area 1 for storing waveform data and an area 2 for imparting a reverberation effect. During evaluation, the waveform data is sequentially read out from the area 1 by using an absolute address, and sampled data of the waveform data is written into and read out from the area 2 by using a relative address, thereby imparting a reverberation effect.

10 Claims, 1 Drawing Sheet

REVERBERATION EFFECT IMPARTING APPARATUS

BACKGROUND OF THE INVENTION

1. Field of the Invention

The invention relates to a reverberation effect imparting apparatus in which, when a reverberation effect such as a delay or reverb is to be evaluated, connecting an external tone generator is not required for the evaluation.

2. Related art

Conventionally, in order to produce a sound field sensation in a generated musical tone, delay-like and reverberation-like effects such as delay and reverb are imparted to a musical tone signal. Recently, such effects are imparted by constructing a predetermined effect algorithm in a DSP (Digital Signal Processor) and supplying a musical tone signal to the DSP to be processed.

In some cases, evaluating (checking) the degree of a reverberation effect to be imparted is required. In such cases, conventionally, evaluation is conducted by inputting a signal generated by an external tone generator such as a pulse generator or a rhythm machine, imparting an effect to the signal, and actually outputting the resulting signal to the outside as a sound. When an apparatus incorporates a tone generator dedicated for evaluation, similar evaluations can be conducted in the apparatus alone. However, the addition of such a configuration irrespective of the original object of imparting a reverberation effect increases the cost of the apparatus as a whole. Therefore, a reverberation effect imparting apparatus formed as a single unit cannot employ such a configuration.

Some of recent reverberation effect imparting apparatuses have a function of a so-called sampling device. These apparatuses can serve as a tone generator but cannot simultaneously impart a reverberation effect. When one of the apparatuses is used as a single unit, therefore, it is impossible to evaluate a reverberation effect.

SUMMARY OF THE INVENTION

The invention was developed in view of the circumstances described above. It is an object of the invention to provide a reverberation effect imparting apparatus which can evaluate a reverberation effect without requiring the addition of a special component.

In order to solve the problem, according to the invention, a reverberation effect imparting apparatus in which sampled data of a musical-tone signal is written into a storage means and the data is read out after an elapse of a predetermined time period, thereby imparting a reverberation effect that is configured so that a storage area of the storage means is divided into first and second storage areas, waveform data is stored in the first storage area, the second storage area is allocated to an area for imparting a reverberation effect, and, during evaluation, the waveform data is sequentially read out from the first storage area, and the sampled data is written into and read out from the second storage area, thereby imparting a reverberation effect to the waveform data.

DETAILED DESCRIPTION OF THE PREFERRED EMBODIMENTS

Hereinafter an embodiment of the invention will be described with reference to the accompanying drawings.

Configuration of Embodiment

Figure 1:
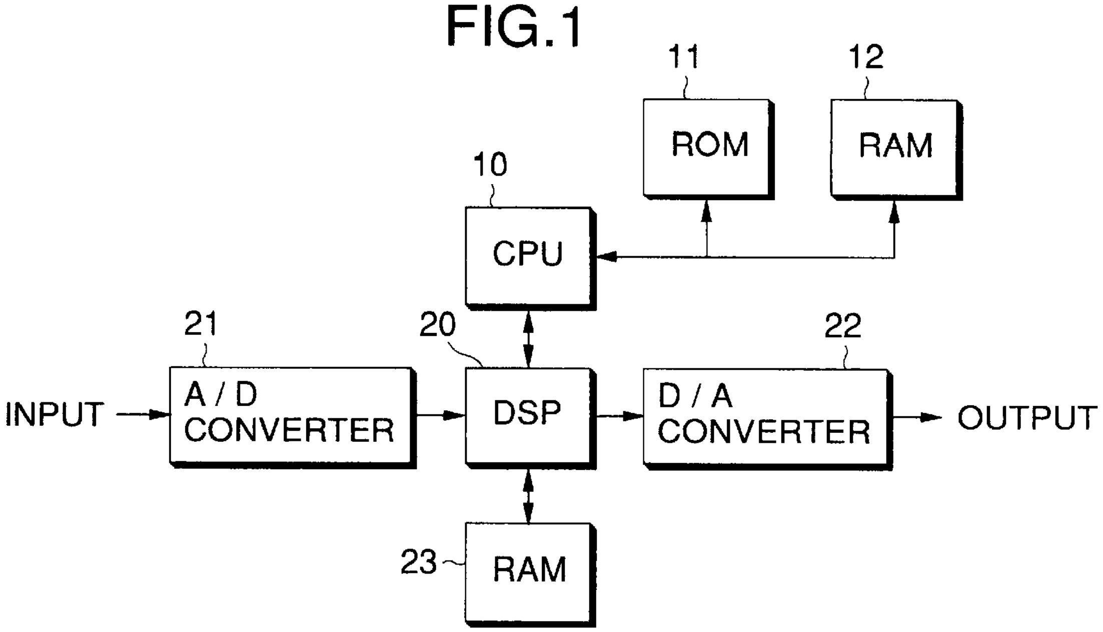
FIG. 1 is a block diagram showing the configuration of a reverberation effect imparting apparatus which is an embodiment of the invention.

FIG. 1 is a block diagram showing the configuration of a reverberation effect imparting apparatus which is an embodiment of the invention.

Referring to the figure, a CPU 10 controls various portions on the basis of a fundamental program stored in a ROM 11. The ROM 11 stores, in addition to the fundamental program, a control program for imparting a reverberation effect, plural waveform data which are used for evaluation, and the like. A RAM 12 temporarily stores data and the like which are produced as a result of the control of the CPU 10.

A DSP 20 imparts a reverberation effect to an input signal which has been converted into a digital signal by an A/D converter 21. The output of the DSP is returned or converted into an analog signal by a D/A converter 22, and then supplied to a loudspeaker, a headphone (both are not shown), or the like via an amplifier. A RAM 23 is used for delaying data when the DSP 20 imparts a reverberation effect, and, in the embodiment, stores waveform data for evaluation.

The reverberation effect imparting apparatus of the embodiment comprises an operation panel through which various instructions are input and the degree or contents of a reverberation effect, and the like are set, in addition to the illustrated components.

Figure 2:
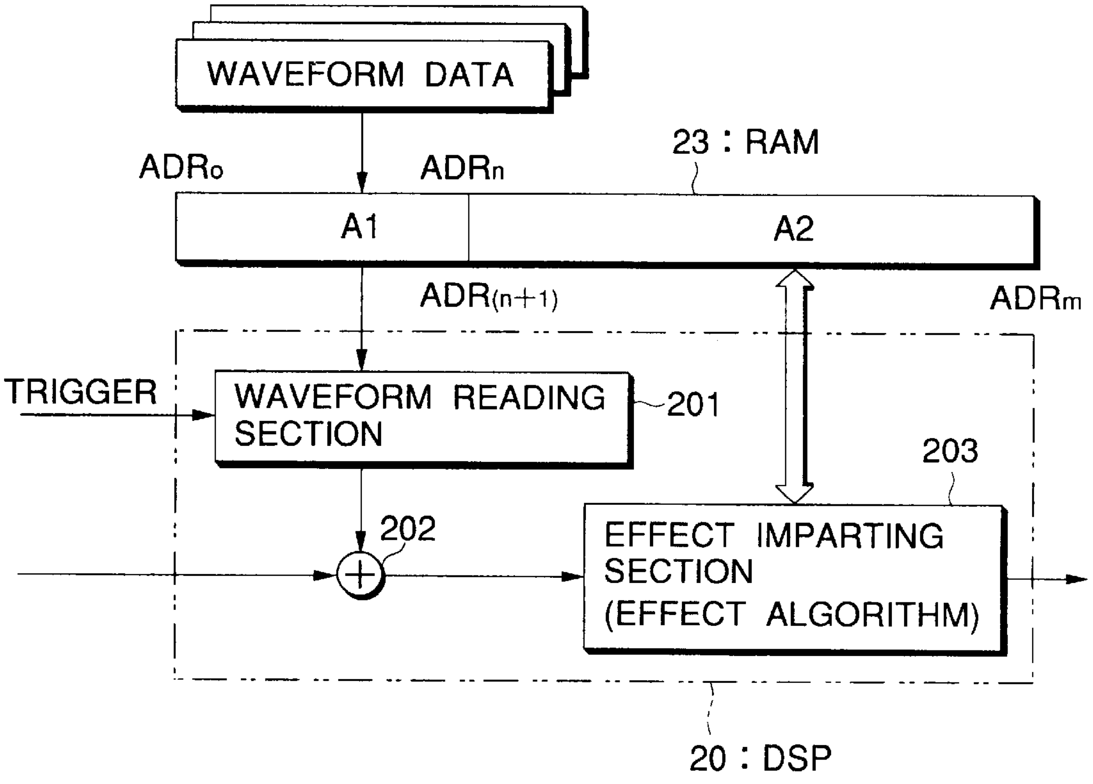
FIG. 2 is a block diagram showing the configuration of a DSP and a RAM of the reverberation effect imparting apparatus.

The DSP 20 and the RAM 23 will be described in detail with reference to FIG. 2.

As shown in the figure, the RAM 23 has a storage area having address 0 to address m (addresses $ADR_0$ to $ADR_m$). The storage area of the RAM is divided into an area A1 corresponding to addresses $ADR_0$ to $ADR_n$, and an area A2 corresponding to addresses $ADR_{(n+1)}$ to $ADR_m$ (where $0<n<m$). The area A1 is used for storing the waveform data for evaluation, and the area A2 is used for, when the DSP 20 imparts a reverberation effect, delaying data by a predetermined time period.

The DSP 20 comprises: a waveform reading section 201 which reads out the waveform data stored in the area A1; an adder 202 which adds the read out waveform data and input data; and an effect imparting section 203 which imparts a reverberation effect to the addition result. The effect imparting section 203 imparts a reverberation effect in accordance with an effect algorithm constructed under the control of the CPU 10.

Specifically, impartation of a reverberation sound is conducted in the following manner. Reverberation consists of a first component or a direct sound which directly propagates from a sound source to the listener, a second component or an initial reflected sound which propagates with a slight delay with respect to the direct sound, and a third component or a reverberation sound which succeeds the initial reflected sound and in which the amplitude and the delay time are periodically changed. Signals respectively corresponding to these sounds are formed by sequentially delaying and/or attenuating the input signal, and the signals are added to each other, thereby imparting a reverberation effect.

To comply with this, the effect imparting section 203 suitably writes data into the area A2, and reads out the data after an elapse of a predetermined time period so that the data is delayed by the predetermined time period.

Operations such as control of the effect algorithm constructed in the effect imparting section 203, and designation of the timing and address which are used for writing and reading a data into and from the area A2 are executed by the control program stored in the ROM 11. Hereinafter, an address which is used in the writing and reading operations on the RAM 23 will be described. Since the area A1 is already used for storing the waveform data, an address in the area A2 is designated by a relative address in which address $ADR_{(n+1)}$ is set to be address 0, while an address in the area A1 is designated by an absolute address.

For the sake of convenience in description, the DSP 20 is configured by the waveform reading section 201, the adder 202, and the effect imparting section.203. Actually, these components are no more than a representation of an algorithm constructed by the control program in the same manner as the effect algorithm, in the form of blocks.

Operation of Embodiment

Next, the operation of the reverberation effect imparting apparatus will be described. The reverberation effect imparting apparatus imparts a predetermined reverberation effect to an input signal. The effect algorithm for impartation is not directly related to the invention, and hence the description of that algorithm is omitted. Therefore, the following description will be made under the assumption that the effect algorithm is already constructed in the effect imparting section 203 in accordance with the control program.

First, through the operation panel (not shown), waveform data which is to be used in the evaluation is selected and instructions of evaluating the reverberation effect which is set at this timing are given. Then, the CPU 10 reads out the selected waveform data from the ROM 11 and writes the data into the area A1 of the RAM 23 in the sequence of sampling.

Next, the CPU 10 sends a trigger signal to the waveform reading section 201 of the DSP 20. Then, the waveform reading section 201 sequentially reads out the waveform data from the area A1, and supplies the data to one input terminal of the adder 202.

As a result, the read out waveform data is added to the input signal by the adder 202, and then subjected to impartation of the predetermined reverberation effect by the effect imparting section 203. The resulting signal is output so as to be used for evaluation of the reverberation effect.

Usually, an input signal to which the reverberation effect is to be imparted is supplied to the other input terminal of the adder 202. In the evaluation, only the waveform data read out from the area A1 is required. Consequently, the other input terminal of the adder 202 may be opened so as to be muted.

In the embodiment, the storage area of the RAM 23 which can be used by the DSP 20 is divided into the area A1 in which a waveform data is to be stored, and the area A2 which is used for the delaying operation, and, during evaluation, the reverberation effect is imparted to the waveform data read out from the area A1. The configuration shown in FIG. 1 does not have any component added to a conventional configuration, and hence can evaluate the reverberation effect without requiring an addition of a special component.

Furthermore, the embodiment is configured so that the ROM 11 stores plural waveform data and one of the data is written into the RAM 23. Therefore, it is possible to select waveform data suitable for evaluating the reverberation effect. According to this configuration, the reverberation effect can be evaluated more appropriately.

As described above, according to the invention, a reverberation effect can be evaluated without requiring the addition of a special component.

What is claimed is:

1. A reverberation effect imparting apparatus comprising:

a first storage device into which sampled data of a musical-tone signal is written, wherein said storage device is divided into first and second storage areas, said first storage area being allocated for storing sample waveform data, said second storage area being allocated for writing into and reading out the sample waveform data to which a reverberation effect is to be imparted; and means for imparting the reverberation effect to the sample waveform data, wherein the sample waveform data is sequentially read out from said first storage area to said reverberation imparting means, and the sample waveform data is written into and read out from said second storage area with said reverberation imparting means to thereby impart the reverberation effect to the sample waveform data including the sample waveform data being read out from the second storage area after an elapse of a predetermined time period.

2. A reverberation effect imparting apparatus according to claim 1, wherein reverberation imparting means further includes means for writing into and reading from said first storage area using an absolute address, and means for writing into and reading from said second storage area using a relative address.

3. A reverberation effect imparting apparatus according to claim 1, wherein said first storage area is further formed for storing plural sample waveform data in a selectable manner.

4. A method for evaluating a reverberation effect, comprising the steps of:

selecting sample waveform data to be used in an evaluation;

providing instructions for evaluating the reverberation effect set at a designated timing;

reading out the selected sample waveform data from a ROM and writing the selected sample waveform data into a first predetermined area of a RAM in a sequence of sampling;

reading out the sample waveform data from the first predetermined area of the RAM; and imparting the reverberation effect to the sample waveform data read out from the first predetermined area of the RAM thereby generating reverberated waveform data.

5. A method according to claim 4, wherein said step of imparting the reverberation effect to the reverberated waveform data includes storing and reading out the reverberated waveform data via a second predetermined area of the RAM whereby a delay of a predetermined time period is imparted on the reading of the reverberated waveform data.

6. A method according to claim 4, further comprising the steps of:

adding the sample waveform data read out from the first predetermined area of the RAM to input data for the evaluation so as to generate reverberation data; and imparting the reverberation effect to the reverberation data.

7. A method according to claim 5, wherein said steps of writing and reading the selected waveform data via the first predetermined area of the RAM are conducted using an absolute address, and said steps of writing and reading the selected waveform data via the second predetermined area of the RAM are conducted using a relative address.

8. A system for imparting a reverberation effect on a musical-tone signal for evaluation, comprising:

first storage means for storing and reading out sample waveform data selected for performing an evaluation;

processing means for controlling the imparting of a reverberation effect to input data, said processing means including means for reading out the selected sample waveform data from said first storage means to be used as the input data and means for imparting the reverberation effect to the input data; and second storage means for storing and reading out reverberation data on which the reverberation effect is imparted by said processing means, wherein said processing means further includes means for delaying the reverberation data by a predetermined time period via said second storage means.

9. A system according to claim 8, wherein said processing means further includes means for adding an input signal to the selected sample waveform data from said first storage means to thereby generate the input data on which the reverberation effect is imparted.

10. A system according to claim 8, wherein said first storage means is further for storing and reading out the selected sample waveform data using an absolute address, and said second storage means is further for storing and reading out the reverberation data using a relative address.

* * * * *